United States Patent [19]

Kollitz et al.

[11] 4,122,390

[45] Oct. 24, 1978

[54] APPARATUS FOR SENSING AND INDICATING THE ANGULAR RELATIONSHIP BETWEEN A TOWING AND A TOWED VEHICLE

[76] Inventors: Gerhard Kollitz, 7535 Marilyn Dr., Corona, Calif. 91720; Frank L. Trapschuh, 9191 Cecilia, Downey, Calif. 90241

[21] Appl. No.: 875,184

[22] Filed: Feb. 6, 1978

Related U.S. Application Data

[63] Continuation-in-part of Ser. No. 736,432, Oct. 28, 1976.

[51] Int. Cl.² ............................................. G01R 27/02
[52] U.S. Cl. .................................. 324/65 R; 280/432; 340/70; 340/52 R; 340/687
[58] Field of Search ............. 324/65 R; 280/432, 292, 280/446 R; 340/52 R, 61, 70, 275, 282

[56] References Cited

U.S. PATENT DOCUMENTS

| | | | |
|---|---|---|---|
| 2,754,499 | 7/1956 | Jost | 340/282 |
| 2,856,036 | 10/1958 | Mullen | 280/432 UX |
| 3,237,177 | 2/1966 | Sparks et al. | 280/432 UX |
| 3,605,088 | 9/1971 | Savelli | 340/52 R X |
| 3,833,928 | 9/1974 | Gavit et al. | 340/282 X |
| 3,947,839 | 3/1976 | Zigmant | 340/52 R X |
| 4,008,466 | 2/1977 | Smith | 340/52 R X |

*Primary Examiner*—Stanley T. Krawczewicz
*Attorney, Agent, or Firm*—Jackson & Jones Law Corporation

[57] ABSTRACT

A sensing apparatus having a stationary part and a movable part which rotates in relation to the stationary part, is attached to both a towing and the towed vehicle so that the stationary part is fixedly attached to one vehicle and the movable part is relatively fixedly attached to the other vehicle. The angular relationship between the towing and the towed vehicle is reflected in the angular relationship between the stationary part and the movable part of the sensing apparatus. This angular relationship is electrically sensed and displayed on an indicating device in the towing vehicle.

2 Claims, 7 Drawing Figures

APPARATUS FOR SENSING AND INDICATING THE ANGULAR RELATIONSHIP BETWEEN A TOWING AND A TOWED VEHICLE

CROSS-REFERENCE TO RELATED APPLICATON

This is a continuation-in-part of application Ser. No. 736,432 filed on Oct. 28, 1976 for Apparatus for Sensing and Indicating the Angular Relationship Between a Towing and a Towed Vehicle.

BACKGROUND OF THE INVENTION

The present invention relates generally to improvements in automotive accessories, and more particularly, pertains to a new and improved sensing and indicating device that informs the driver of a towing vehicle of the angular relationship between a towing vehicle and a towed vehicle, which is universally connected thereto.

When driving a toweing vehicle in reverse, it is extremely difficult to maintain a desired alignment between the towing vehicle and a towed vehicle universally connected thereto. This movement is further complicated when the towing vehicle is of the type whereby the driver can only see behind the towing vehicle through side mirrors. As a partial solution to this problem, devices have been devised for indicating to the driver of the towing vehicle the relative angular positons of the towing vehicle and the towed vehicle. However, these devices have not found general nor widespread acceptance because of their complicated nature, difficulty in attaching them to the vehicle, and the cost thereof.

OBJECTS AND SUMMARY OF THE INVENTION

An object of this invention is to provide an improved apparatus for indicating the angular relationship between a towing and a towed vehicle.

Another object of this invention is to provide a reliable and inexpensive apparatus for indicating the angular relationship between a towing and a towed vehicle that is easily attached to the vehicles involved.

Yet another object of this invention is to provide an apparatus for indicating the angular relationship between a towing and a towed vehicle that is useable with a variety of hitch arrangements.

These objects and the general purpose of this invention are accomplished as follows. A variable resistor-type potentiometer is mounted at the point of rotational union between a towing and a towed vehicle. The body portion of the variable resistor is regidly attached to one vehicle. Its rotating arm is rigidly attached to the other vehicle. The attachment means for both the body portion and the rotating arm portion permits disengagement from the vehicles. The variable resistor is connected into a resistive bridge circuit having a meter therein. The bridge circuit is connected to the power source of the towing vehicle. Movement of the rotating arm caused by the angular displacement between the towing and towed vehicle varies the resistance of the variable resistor which is reflected in the bridge circuit. The meter in the bridge circuit, in response thereto, gives a representative indication of the angular displacement between the towing and towed vehicle.

BRIEF DESCRIPTION OF THE DRAWINGS

Other objects and many of the attendant advantages of the invention will be readily appreciated as the same becomes better understood by reference to the following detailed description when considered in conjunction with the accompanying drawings in which like reference numerals designate like parts throughout the figures thereof, and wherein.

DESCRIPTION OF THE PREFERRED EMBODIMENTS

Figure 1:
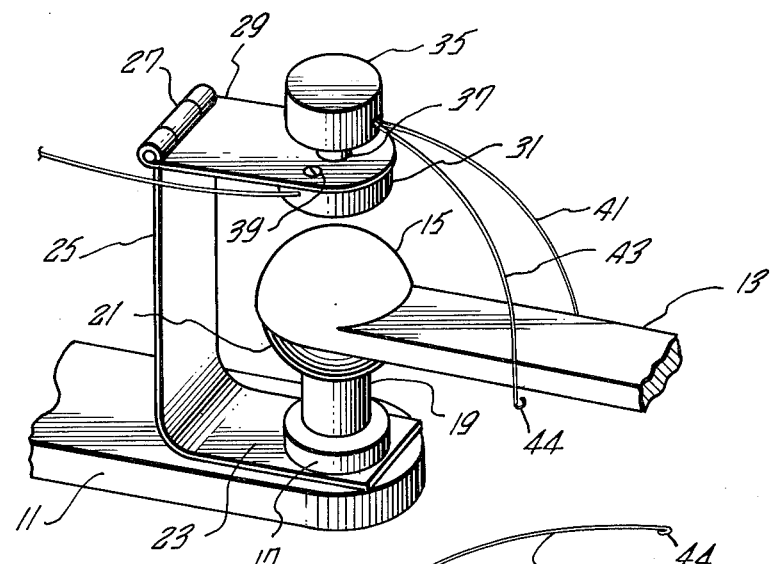
FIG. 1 is a perspective view of a preferred embodiment of the present invention.

Referring first to FIG. 1, the preferred embodiment of the present invention as adapted to a universal ball-hitch trailer assembly is illustrated. The hitch assembly to which the present invention is attached comprises an extension plate 11, which is attached to the towing vehicle. Fastened thereto is a ball assembly having a ball 21 mounted on a stem 19 fastened to a base 17. The entire ball assembly is fastened to the extension 11 through an aperture therein (not shown) by a bolt and nut arrangement (not shown). The tongue 13 is fastened to the towed vehicle. A cup 15 is attached to the tongue. The cup fits over and pivots on the ball 21 attached to the towing vehicle.

The present invention is easily attached to the hitch assembly of the towing vehicle by loosening the bolt and nut arrangement (not shown), maintaining the ball assembly fastened to the extension 11. The mounting bracket for the sensing device of the present invention consists of a parallel portion 29 being hinged by hinge 27 to an orthogonal portion 25, which is attached to an adjacent portion 23. This mounting bracket is fastened and held to the extension 11 by the ball assembly. The nut of the ball assembly (not shown) is passed through an aperture (not shown) in the adjacent portion 23 of the bracket and held against the extension 11 by the base 17 of the ball assembly when it is fastened down by its nut and bolt arrangement (not shown).

Figure 2:
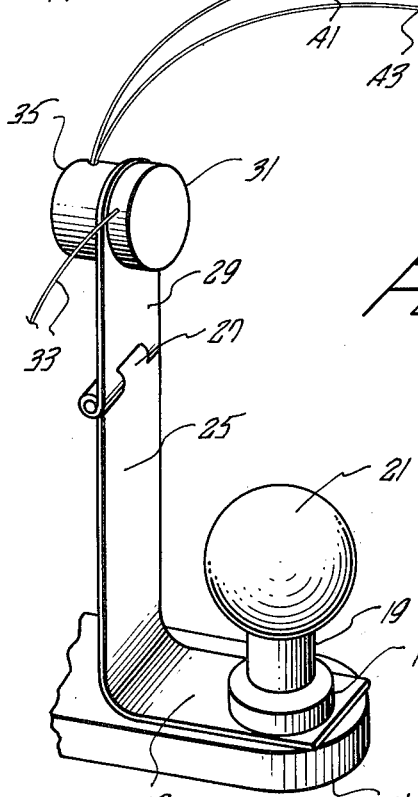
FIG. 2 is a perspective view of the preferred embodiment of FIG. 1 in a disengaged position.
Figure 3:
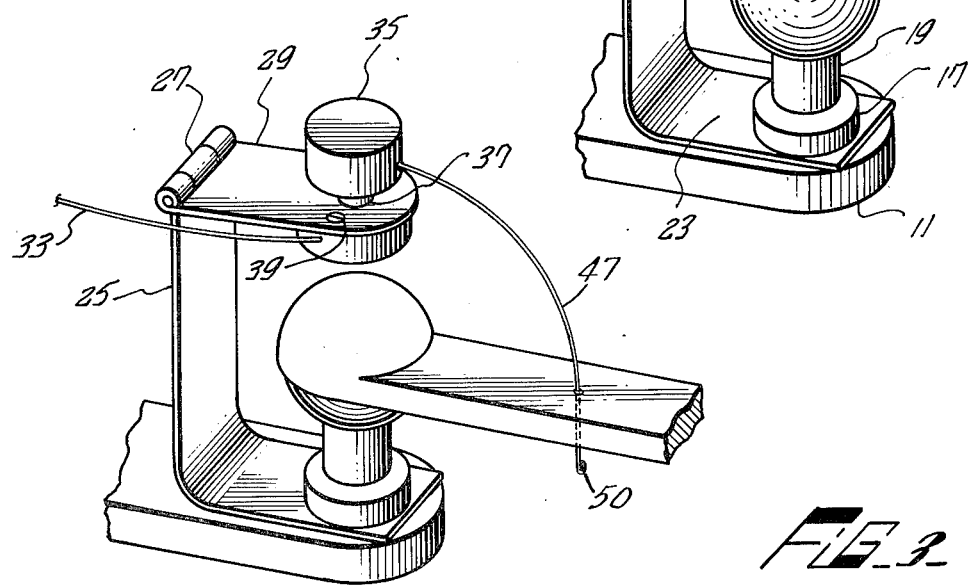
FIG. 3 is a perspective view of an alternate preferred embodiment of the present invention.

It is to be understood from the nature of this invention that while FIGS. 1, 2 and 3 show a pinned hinge 27, hinges of various other types might be equally suitable for the practice of this invention, and therefore are intended to be within the scope of this invention.

The mounting bracket consisting of the adjacent portion 23, orthogonal portion 25, parallel portion 29, and hinge 27, provides a mounting area on parallel portion 29 for the sensing device that detects the relative angle of displacement between the extension 11 and the tongue 13 of the towing and towed vehicle, respectively. This mounting area places the sensing device close to the axis of rotation of the union between the towing and towed vehicle.

The sensing device comprises a variable resistor, preferably of the rotating-arm type. The body 31 of the variable resistor is mounted to the end of parallel portion 29 opposite the hinge 27, directly over the center of rotation of the ball 21 and cup 15. It may be fastened thereto by means of machine screws 39. The shaft 37 of the variable resistor arm extends through an aperture in the end portion 29 and is fastened to a cylindrical disc 35. Electrical wires 33 attached to the variable resistor 31 are supplied to the interior of the automobile to be connected to an indicating device as will be described below. The disc 35 which is attached to the shaft 37 of the variable resistor has rigidly attached thereto a pair of feeler wires 41, 43, which encompass the tongue 13 of the towed vehicle, as shown in FIG. 1, on each side of the tongue 13. The feeler wires 41 and 43 are made of spring steel or like material, and their respective end portions which are placed immediately below the tongue 13 are hook shaped 44. The feeler wires 41 and 43 embrace the tongue 13 with sufficient spring force to prevent their accidental dislocation. The same spring force pulling the feeler wires 41 and 43 towards each other and the hook shaped ends 44 also prevent an accidental upwardly pivoting movement of the sensing device, which is mounted upon the hinged parallel position 29.

Because the variable resistor body 31 is attached to the extension 11 of the towing vehicle in a stationary manner, any amount of angular displacement between the extension 11 and the tongue 13 of the towing and towed vehicle, respectively, causes the feelers 41, 43 to impart a tangential force to the disc 35, causing the shaft 37 of the variable resistor to rotate and change the setting of the variable resistor. This change is reflected and displayed in a manner to be described below.

FIG. 2 illustrates the apparatus of FIG. 1 in a disengaged relationship wherein the parallel extension 29 of the bracket is lifted up to be in a plane of the perpendicular portion 25 of the mounting bracket. With the feelers 41, 43 thus positioned out of engagement with the tongue 13 of the towed vehicle, the tongue may be removed from the ball hitch with ease and without damage to the sensing device of the present invention.

FIG. 3 illustrates an alternate preferred embodiment of the present invention. Rather than utilizing a pair of feelers as illustrated in FIGS. 1 and 2, a single feeler wire 47 is attached to the disc 35. An aperture 49 must be drilled through the tongue 13 of the towed vehicle. This aperture, then, receives the single feeler wire 47 which is also made of spring steel or like material and also has a hook shaped end 50. The feeler wire 47 develops sufficient spring force between the tongue 13 and the sensing device to hold the hinged parallel portion 29 upon which the sensing device is mounted in operating position, and to prevent its accidental upwardly movement.

Figure 4:
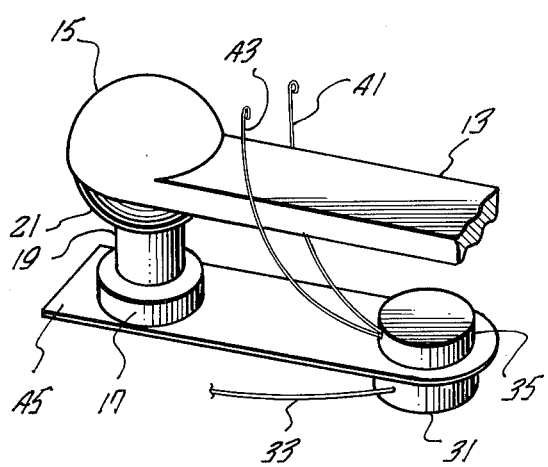
FIG. 4 is a perspective view of another alternate preferred embodiment of the present invention.

FIG. 4 illustrates another alternate preferred embodiment of the present invention wherein the sensing device, consisting of the variable resistor, the rotating disc 35, and a pair of feeler wires 41, 43 are mounted on a plate 45. This plate is held down at one end thereof by the universal ball-hitch assembly, comprising ball 21, stem 19, and base 17 in the same manner that mounting bracket is held down in FIG. 1. The plate 45, however, extends out towards the towing vehicle and is parallel to the tongue 13 of the towing vehicle. The feelers 41, 43, rather than bending down to engage the sides of the tongue 13, bend upwards from underneath the tongue to engage its sides. The variable resistor, again, is stationary with respect to the towing vehicle on which the ball assembly is mounted. Any relative angular displacement between the tongue and the ball assembly is reflected by a rotation of the disc 35, which causes the shaft of the variable resistor to rotate. To disengage the towing and the towed vehicle, the tongue 13 of the towed vehicle is simply lifted up and out of engagement with the feelers 41, 43.

Figure 5:
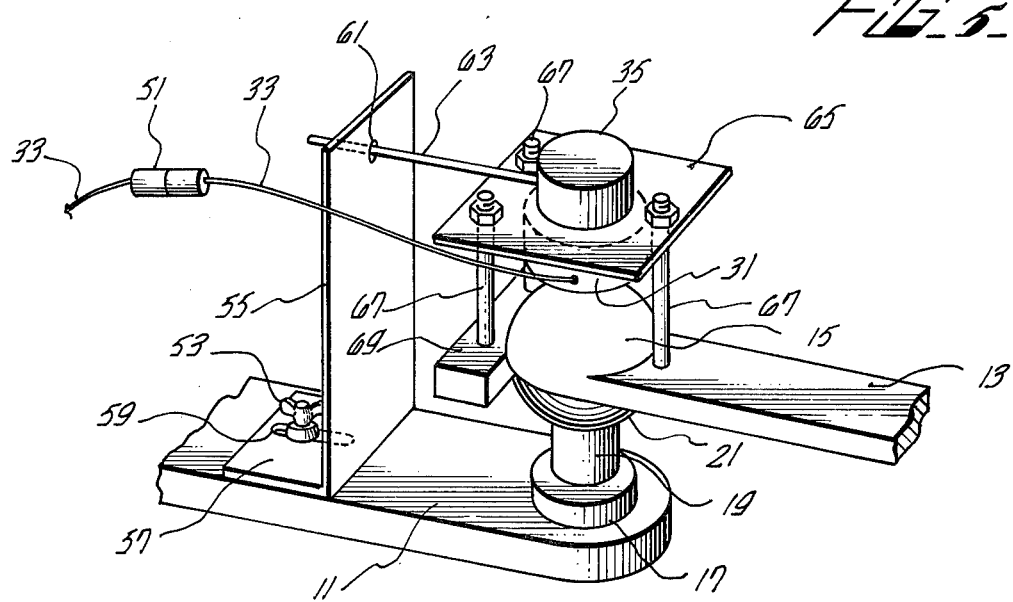
FIG. 5 is a perspective view of yet another alternate preferred embodiment of the present invention.

FIG. 5 illustrates another alternate preferred embodiment of the present invention wherein the sensing mechanism is mounted on the tongue 13 of the towed vehicle over the approximate center of rotation of the cup 15 attached to the tongue. A mounting plate 65, held into position by a plurality of studs and bolts 67, which are in turn fastened to the tongue 13 of the towed vehicle (not shown), is positioned over the cup 15 attached to the tongue 13 of the towed vehicle. The studs 67 fasten to the tongue 13 and the ridge 69 that is generally formed around the cup 15 of the tongue. The variable resistor body 31 is attached to the plate 65 by screws (not shown). The shaft of the rotating arm extends through an aperture in the plate 65 and fastens to the disc 35.

The disc 35 has rigidly attached thereto a straight steel rod 63 that extends parallel to the extension 11 towards the towing vehicle. An angular plate, having a portion 55 perpendicular to the extension 11 of the towing vehicle, has an aperture 61 therethrough which receives the shaft 63. An orthogonal portion 57 to the angular plate, having an elongated slot 59 therein is held to the extension 11 by way of wing-nut assembly 53.

In other alternate embodiments of the present invention a rigid feeler in the shape of a bar or rod may be rigidly attached to the disc 35. The bar or rod may extend over the tongue 13 of the towed vehicle, and may be connected thereto by a multiplicity of springs. For example two coil springs may be hooked into apertures on two sides of the rod or bar, and the two springs may be connected to each other under the tongue 13 by some suitable means, e.g. a cotter pin, thereby engaging the tongue. Such a fixed attachment of the rod or bar to the tongue by way of springs would prevent the accidental upwardly pivoting movement of the sensing device which is mounted on the hinged parallel portion 29.

Electrical connection from the variable resistor 31 to the interior of the automobile is made by wires 33, which have a pluggable connector 51 therein to facilitate electrical disengagement from the towing vehicle.

Figure 6:
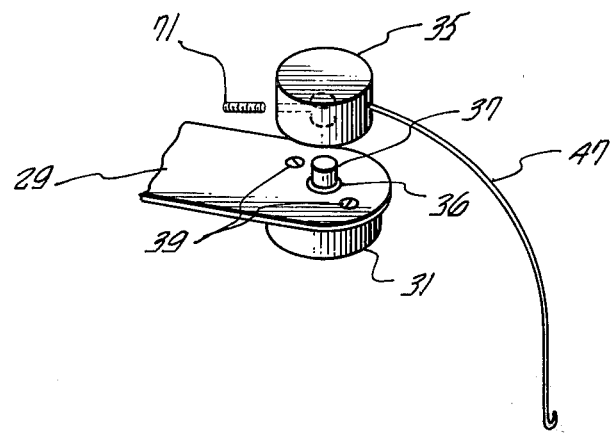
FIG. 6 is a perspective exploded view of a portion of the present invention.

The variable resistor is shown in FIG. 6 as having a shaft 37 extending through an aperture 36 of the portion 29 of the mounting bracket shown in FIG. 1. A pair of metal screws 39 may fasten the variable resistor to this portion of the bracket. The cylindrical disc 35 has an aperture at its symmetrical center for receiving the shaft 37. The disc 35 is held to the shaft 37 by means of the set screws 71 threaded into the disc 35. The feeler wire 47, whether it be a single wire or double wires; is fastened to the disc 35 in a well-known manner such as welding or brazing. The wire 47 is preferably of spring steel.

The movement of the resistor arm attached to the shaft 37 of the variable resistor is reflected in a meter 88 mounted within the driver compartment of the towing vehicle. Meter 88 comprises a simple well known current or voltage sensing movement. The face of the meter preferably indicates degrees of relative displacement between the towing and towed vehicle. This is done, as is well known, by a center zero movement meter. A movement in the resistor arm 32 causes the indicator to swing to the left or right from a center zero position, depending on the voltage present in the bridge circuit. An example of such a movement and its use can be found in U.S. Pat. No. 3,833,928 issued to Gavit et al.

Figure 7:
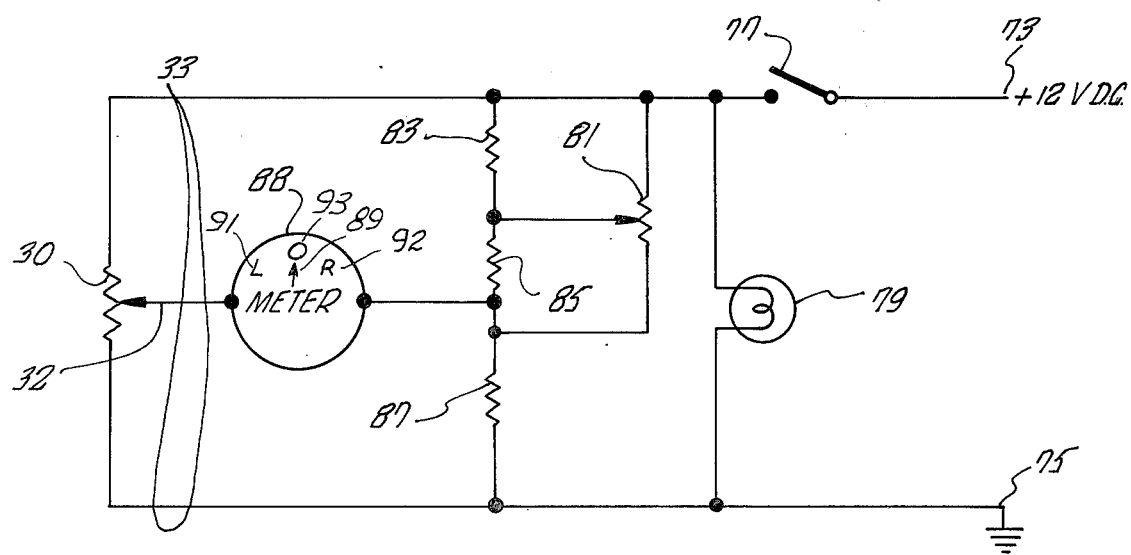
FIG. 7 is a schematic diagram illustrating the circuitry according to the present invention.

As can be seen in FIG. 7, the meter movement 88 is connected into a balanced-bridge circuit. The variable resistor comprises one side of the bridge, the resistors 83, 85, 87 and variable resistor 81 comprises the other side of the bridge. The three wires, labeled 33 in FIG. 7, come from the variable resistor 30 mounted at the hitch assembly. They are supplied to the circuit of FIG. 7, which is enclosed in the housing for the meter movement 88.

As can be seen, the electrical connection 32 from the arm of the variable resistor is attached to one side of the meter 88. The other side of the meter 88 is attached to a point between resistors 83, 85, and 87. Variable resistor 81 is in the circuit to provide a null position or null reference point so that the meter is indicating zero degrees when there is relatively zero degrees angular displacement between the towed and towing vehicle. Consequently, any angular displacement in one direction or another will be reflected by a movement of the shaft 37 of the variable resistor and the contact thereof, causing an imbalance in the resistance bridge circuit in one direction or another. This imbalance is reflected by the meter 88.

The operation of a balanced bridge circuit, such as a Wheatstone bridge, is well known. Reference may be had to the *Standard Handbook for Electrical Engineers*, 10th Ed., McGraw-Hill, Section 2–22, for a complete analysis of the current flow and voltages in the bridge. Briefly, however, the bridge is balanced when no current flows through the meter leg and, therefore, the meter needle 89 points to the rest position 93. For the bridge to be balanced, the variable resistance arm 32 is located effectively at the center of the resistance element 31 so that the top of resistance element 31 times the combined resistance of the resistors 83, 85 and 81 equals the bottom of resistor element 31 times resistor 87.

The variable resistor 81 is used to adjust the null condition of the bridge circuit. Movement of the resistance arm 32 from its relative center location will cause the bridge to become unbalanced, thereby changing the potential at resistor 31 with respect to the potential at resistor 85. Current, therefore, flows through the meter leg causing the needle to deflect to the left 91 or right 92, depending on the direction of current flow through the leg. The direction of current flow will depend on the relative magnitude of the potential at resistor 31 and the resistor 85.

The entire circuit is powered by the twelve volt DC supply 73 of the towing vehicle, which is connected to the circuit by an On/Off switch 77. A light source 79, to indicate that the circuit is on, is connected across the twelve volt supply through switch 77.

What has been described is an improved apparatus for indicating an angular relationship between the towing and towed vehicle which is reliable, inexpensive, and useable with a variety of hitch arrangements. Although a variety of preferred embodiments have been illustrated, it should be understood that numerous modifications may be made therein without departing from the spirit and scope of the invention as set forth in the appended claims.

What is claimed is:

1. Apparatus for sensing and indicating the angular relationship between a towing and a towed vehicle, wherein the towing vehicle includes a ball hitch assembly comprising a ball connected to a shaft which is attached to the towing vehicle, said apparatus comprising:
   a variable resistor having a body portion, a shaft rotatably mounted to said body portion so that the resistance of the variable resistor is varied as the shaft is turned;
   a plate having an orthogonal portion and an aperture, the body part of the variable resistor being rigidly attached to said plate, said shaft protruding through the aperture therein;
   a second plate having a circular aperture, said second plate being mounted to the towing vehicle by sliding the shaft of the ball hitch assembly of the towing vehicle through said circular aperture, said second plate also having an orthogonal portion, said orthogonal portion having an aperture into which is placed the orthogonal portion of said first plate so as to form a hinge;
   a feeler rigidly connected to the shaft of the variable resistor;
   means for fixedly but removably attaching said feeler to the towed vehicle thereby providing for rotational movement of the shaft in relation to the body portion of said variable resistor as the towed vehicle moves in relation to the towing vehicle; and
   an indicator means electrically responsive to the movement between the shaft and body portions of said variable resistor for representatively indicating the angular relationship between the towing and towed vehicle.

2. The apparatus of claim 1 wherein said indicator means includes: a current-responsive indicating means; and a resistive bridge circuit, said current-responsive indicating means being connected to measure current flow in said circuit, the variable resistor being connected to said circuit.

* * * * *